(12) United States Patent
Jenkins

(10) Patent No.: US 10,320,218 B2
(45) Date of Patent: Jun. 11, 2019

(54) REGULATOR CIRCUITS AND METHODS

(71) Applicant: Perceptia Devices Australia, Pty Ltd., Scotts Valley, CA (US)

(72) Inventor: Julian Jenkins, Kurraba Point (AU)

(73) Assignee: Perceptia Devices IP Pty Ltd, Kurraba Point, NSW (AU)

(*) Notice: Subject to any disclaimer, the term of this patent is extended or adjusted under 35 U.S.C. 154(b) by 196 days.

(21) Appl. No.: 15/423,936

(22) Filed: Feb. 3, 2017

(65) Prior Publication Data

US 2017/0229879 A1 Aug. 10, 2017

Related U.S. Application Data

(60) Provisional application No. 62/292,841, filed on Feb. 8, 2016.

(51) Int. Cl.
*H02J 7/00* (2006.01)
*H03M 1/00* (2006.01)

(52) U.S. Cl.
CPC .......... *H02J 7/008* (2013.01); *H03M 1/001* (2013.01)

(58) Field of Classification Search
CPC .................. H02J 7/008; H02M 1/001
USPC ................................................. 320/164
See application file for complete search history.

(56) References Cited

U.S. PATENT DOCUMENTS

2008/0307240 A1* 12/2008 Dahan ............... G06F 1/06 713/320
2016/0370816 A1* 12/2016 Wei .................. G05F 1/56
2017/0330874 A1* 11/2017 Robins ............ H01L 27/0251

* cited by examiner

*Primary Examiner* — Suchin Parihar
(74) *Attorney, Agent, or Firm* — André Grouwstra

(57) ABSTRACT

A voltage or current regulator has a power DAC and ADC in a negative feedback loop, locked to a reference voltage or current. The ADC may have one or more parallel comparators followed by one or more parallel filters. The regulator may include a multiplexer to select between filter output signals and to forward the selected signal to the power DAC. The regulator may receive power management mode control codes to modify filter behavior and/or to select between multiple parallel filters. By modifying the loop behavior, the regulator is able to swiftly change between power management modes supporting different power level and noise profiles. Regulators with a single comparator can lock the output to a single reference voltage or current. Regulators with two comparators can regulate the output to vary within a range limited by an upper and a lower reference voltage or current.

22 Claims, 9 Drawing Sheets

REGULATOR CIRCUITS AND METHODS

CROSS REFERENCES TO RELATED APPLICATIONS

This application claims priority from U.S. Provisional Patent Application Ser. No. 62/292,841, entitled "Regulator Circuits and Methods", filed on Feb. 8, 2016, which is hereby incorporated by reference as if set forth in full in this application for all purposes.

BACKGROUND

The present invention relates generally to regulating energy that is supplied to electronic circuits and particularly to regulating energy within integrated circuits (ICs).

Many electronic systems use supply voltage and/or supply current regulators to provide a stable supply of energy to a sensitive circuit; to provide energy at a different level than is available from the original energy source; and/or to shield an energy source from noise generated by one of the circuits that is using its energy. For instance, a 3.3V battery may be used as an energy source for a sensitive analog circuit operating at 1.5V and a noisy digital circuit operating at 1.0V. By providing the supply voltage for the analog circuit through a first regulator that bridges a 1.8V level shift and providing the supply voltage for the digital circuit through a second regulator that bridges a 2.3V level shift, the analog circuit may be protected twice from noise generated by the digital circuit that may otherwise leak via their battery connections. And both circuits can receive stable supply voltages mostly independent of the battery voltage which may gradually reduce as the battery's charge is used up. Regulators typically include an input for receiving raw energy from a power supply, a regulated output to which a power load may be connected, a reference input, and a ground terminal. A high-efficiency regulator forwards most of the energy received at the input to the power load, and loses only little energy flowing away through the ground terminal.

Regulators often use a filter that may act as an energy buffer to smooth the energy level at its regulated output. They also often use a filter for the regulation mechanism itself, which may be achieved in a negative feedback loop, wherein the regulated energy level is compared with (subtracted from) a reference level. In those cases, a well-designed filter provides stability for the feedback loop.

Power management in complex integrated circuits (ICs) may require multiple regulators, often integrated, to support multiple power domains and multiple modes of activity, such as OFF, various levels of standby and sleep mode, and a fully active mode. In some cases, circuits may abruptly switch from a power-saving mode to fully active mode, and the noise spectrum of energy used may change instantly. Conventional regulators are not adapted for such a change, and as a result, circuits may not be used in the most power saving mode available. Therefore, ICs with conventional regulators may use more energy than necessary. The present invention overcomes this problem and helps circuits operate at the lowest average power possible.

Reference to any prior art in the specification is not, and should not be taken as, an acknowledgment or any form of suggestion that this prior art forms part of the common general knowledge in Australia, USA, or any other jurisdiction or that this prior art could reasonably be expected to be ascertained, understood and regarded as relevant by a person skilled in the art.

SUMMARY

Integrated circuits (ICs) may include circuits that are sensitive to noise along with other circuits that generate a lot of noise. Regulators can provide noise isolation; they can provide energy at the right (voltage or current) level to each of the circuits. Power management in complex ICs may require multiple regulators, often integrated, supporting multiple power domains and multiple modes of activity, such as OFF, various levels of standby and sleep mode, and a fully active mode. In some cases, circuits may abruptly switch from a power-saving mode to fully active mode, and the noise spectrum of energy used may change instantly. Conventional regulators are not adapted for such a change, and as a result, circuits may not be put in the most power saving mode available. Therefore, ICs with conventional regulators may use more energy than necessary. The present invention overcomes this problem and helps circuits operate at the lowest average power possible. Embodiments of the present invention make it possible to provide strong noise isolation while switching very swiftly between various modes of power management.

In a first aspect, embodiments of the invention provide a method of regulating supply energy. The method comprises receiving raw energy from a power supply and receiving a first digital control code. Embodiments forward a portion of the raw energy to a power load, wherein the portion is determined by the first digital control code. The embodiments sense a physical quantity, which may include a voltage or a current, in the power load, and forward it to an analog-to-digital converter (ADC). The ADC receives a first reference physical quantity, and based on the sensed physical quantity and the first reference physical quantity, it generates the first digital control code. The steps are repeated continuously to obtain a proportional relation between the sensed physical quantity and the first reference physical quantity.

The embodiments may filter the ADC output code to obtain the digital control code. In some embodiments, filtering may include using a pole at frequency zero. In further embodiments, filtering may include using two poles at frequency zero and a single zero at a non-zero frequency.

In embodiments, the ADC may comprise a first clocked comparator. They may receive a clock signal and, at a time of receiving a clock signal, compare the sensed physical quantity to the first reference physical quantity to obtain a first clocked comparator output code. Upon filtering the first clocked comparator output code to obtain the digital control code, these embodiments lock the sensed physical quantity to the first reference physical quantity.

In further embodiments, the ADC may comprise a second clocked comparator. These further embodiments may receive a second reference physical quantity. At a time of receiving a clock signal, they compare the sensed physical quantity to both the first and second reference physical quantities. These embodiments combine the first and second clocked comparator output signals to obtain a combined filter input signal, which they filter in the first digital filter to obtain the updated first digital control code and to allow the sensed physical quantity to vary between the first and second reference physical quantities.

Embodiments may receive a mode control code and use the mode control code to modify filter behavior and/or to select between multiple parallel filters.

In a second aspect, embodiments of the invention provide a method of regulating supply energy that comprises receiving an analog control signal, receiving raw energy from a power supply, and forwarding a portion of the raw energy to a power load, wherein the portion is determined by the analog control signal. The embodiments sense a physical quantity related to the portion of the raw energy in the power load, and forward the sensed physical quantity (voltage or current) to a clocked comparator. In the clocked comparator they compare the sensed physical quantity with a reference physical quantity to obtain a clocked comparator output signal. They filter the clocked comparator output signal in two or more parallel analog filters. Based on a received mode control code, they select one of the analog filters' output signal to be the analog control signal.

In a third aspect, embodiments of the invention provide a level regulator circuit, comprising a power digital-to-analog converter (DAC) with a raw energy input, a digital control code input, and a regulated power output, wherein the raw energy input is configured to receive raw energy from a power supply, and the regulated power output is configured to deliver regulated energy to a power load; a clocked comparator, with a first input coupled with the regulated power output, and with a second input configured to receive a reference physical quantity; and a digital filter, with an input coupled to a clocked comparator output, and with a mode control code input, wherein the digital filter is capable of modifying filter parameters based on a code received on the mode control code input, and with an output coupled with the power DAC digital control code input.

In a fourth aspect, embodiments of the invention provide a level regulator circuit, comprising a power digital-to-analog converter (DAC) with a raw energy input, a digital control code input, and a regulated power output, wherein the raw energy input is configured to receive raw energy from a power supply, and the regulated power output is configured to deliver regulated energy to a power load; a clocked comparator, with a first input coupled with the regulated power output, and with a second input configured to receive a reference physical quantity; two or more digital filters, each with an input coupled with a clocked comparator output; and a digital multiplexer with inputs each coupled with a separate output of the two or more digital filters, wherein the digital multiplexer is configured to receive a mode control code, and based on the mode control code select one of the two or more digital filters, and with an output coupled with the power DAC.

In a fifth aspect, embodiments of the invention provide a range regulator circuit, comprising a power digital-to-analog converter (DAC) with a raw energy input, a digital control code input, and a regulated power output, wherein the raw energy input is configured to receive raw energy from a power supply, and the regulated power output is configured to deliver regulated energy to a power load; a first and a second clocked comparator, each with a first input coupled with the regulated power output, and with a second input configured to receive a separate reference physical quantity; and a first digital filter, with inputs coupled with outputs of the first and second clocked comparator, and with an output coupled with the power DAC digital control code input.

In a sixth aspect, embodiments of the invention provide a two-step regulator system, comprising a range regulator with a raw energy input configured to receive raw energy from a power supply, two reference inputs, and a regulated power output coupled to an energy storage device; a level regulator with a raw energy input coupled to the range regulator regulated power output, one reference input, and a regulated power output coupled to a power load; wherein: the range regulator is configured to regulate a first physical quantity on the energy storage device between limits determined by signal levels on the two range regulator reference inputs; and the level regulator is configured to regulate a second physical quantity on the power load to a level determined by a signal level on the level regulator reference input.

As used herein, except where the context requires otherwise, the term "comprise" and variations of the term, such as "comprising", "comprises" and "comprised", are not intended to exclude further additives, components, integers or steps.

Further aspects of the present invention and further embodiments of the aspects described in the preceding paragraphs will become apparent from the following description, given by way of example and with reference to the accompanying drawings.

BRIEF DESCRIPTION OF THE DRAWINGS

The invention will be described with reference to the drawings, in which.

DETAILED DESCRIPTION

Integrated circuits (ICs) may include circuits that are sensitive to noise along with other circuits that generate a lot of noise. Regulators can provide noise isolation; they can provide energy at the right (voltage and/or current) level to each of the circuits. Power management in complex ICs may require multiple regulators, often integrated, supporting multiple power domains and multiple modes of activity, such as OFF, various levels of standby and sleep mode, and a fully active mode. In some cases, circuits may abruptly switch from a power-saving mode to fully active mode, and the noise spectrum of energy used may change instantly. Conventional regulators are not adapted for such a change, and as a result, circuits may not be put in the most power saving mode available. Therefore, ICs with conventional regulators may use more energy than necessary. The present invention overcomes these problems and helps circuits operate at the lowest average power possible. Embodiments of the present invention make it possible to provide strong noise isolation while switching very swiftly between various modes of power management.

Figure 1:
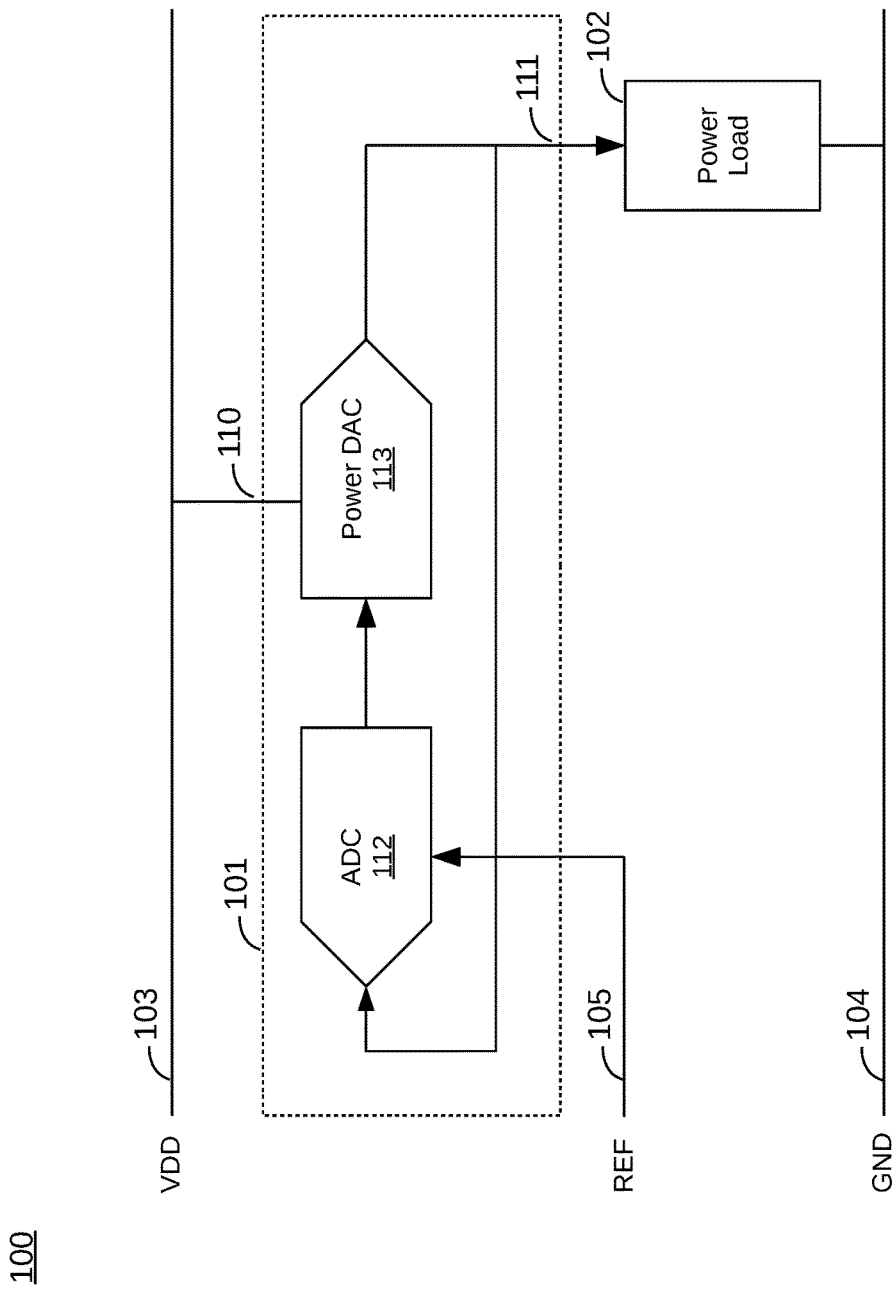
FIG. 1 illustrates an example digital regulator according to embodiments of the invention.

FIG. 1 illustrates an example digital regulator 101 according to embodiments of the invention. System 100 includes digital regulator 101 that supplies regulated energy to power load 102. Digital regulator 101 receives raw energy from a power supply via VDD rail 103 and at least a portion of the raw energy flows through power load 102 to ground (GND) rail 104. Digital regulator 101 includes a reference input 105 for receiving a first reference physical quantity, a raw energy input 110, and a regulated energy output 111.

In an embodiment, VDD rail 103 may carry raw energy at a first voltage level, whereas the power load 102 may require energy regulated at a second voltage level. In another embodiment, VDD rail 103 may carry raw energy at a first current level, whereas the power load 102 may require energy regulated at a second current level. Whether the physical quantity to be regulated includes a voltage or a current, or both, or another quantity (e.g., temperature or emitted light) related to the energy in the power load, embodiments of the invention use the same basic method of regulation.

The embodiment 101 of the digital regulator comprises an analog-to-digital converter (ADC) 112 and a power digital-to-analog (DAC) 113. ADC 112 and power DAC 113 are configured in a negative feedback control loop whose operation may be described from any point in the loop. Power DAC 113, at its digital input, receives a first digital control code. An initial value for the first digital control code may be pre-programmed or otherwise pre-supplied, or it may be supplied by the digital output of ADC 112.

Power DAC 113 receives raw energy from a power supply via VDD rail 103 at raw energy input 110, and forwards a portion of the raw energy to power load 102 via regulated energy output 111. The portion is determined by the first digital control code. A difference between the raw energy received and the regulated energy forwarded to power load 102 may flow away to ground via a regulator 101 ground terminal (not drawn).

ADC 112, at its analog input, senses a physical quantity related to the portion of the raw energy in the power load. If the sensed physical quantity is a voltage, an embodiment may directly (as drawn) couple the ADC 112 analog input with regulated energy output 111, or indirectly via, for example, a resistive voltage divider network. If the physical quantity is a current, an embodiment may sense it in a variety of ways, as known in the art, for example employing a current mirror to obtain a copy of the sensed current, or employing a series resistor between power DAC 113 and regulated energy output 111 to convert the sensed current to a sensed voltage. ADC 112 receives a first reference physical quantity at its reference input 105, and generates an updated first digital control code based on the sensed physical quantity and the first reference physical quantity. In embodiments, the first digital control code may be based on a negative difference between the sensed physical quantity and the first reference physical quantity, divided by the first reference physical quantity. In other embodiments, there may be different relations between the first digital control code, the sensed physical quantity, and the first reference physical quantity.

ADC 112 forwards the updated first digital control code to power DAC 113, which in response to receiving a higher first digital control code value may increase the portion of raw energy forwarded to power load 102 and in response to receiving a lower first digital control code value may decrease the portion of raw energy forwarded to power load 102. Since the loop features negative feedback, as known in the art the sensed physical quantity will stabilize to a value proportional to a value of the first reference physical quantity. Therefore, even though power load 102 may consume energy that varies over time, digital regulator 101 regulates the available energy as expressed by the sensed physical quantity at a stable level determined by the first reference physical quantity. Therefore, for the purposes of this document, digital regulator 101 is classified as a level regulator.

ADCs and DACs often operate on the basis of a sample clock, where a converter may provide an updated value at its output each one or more clock periods. ADC 112 and power DAC 113 may be clocked converters or they may be instantaneous converters, in which case their output value would change as soon as their input value changes.

Figure 2:
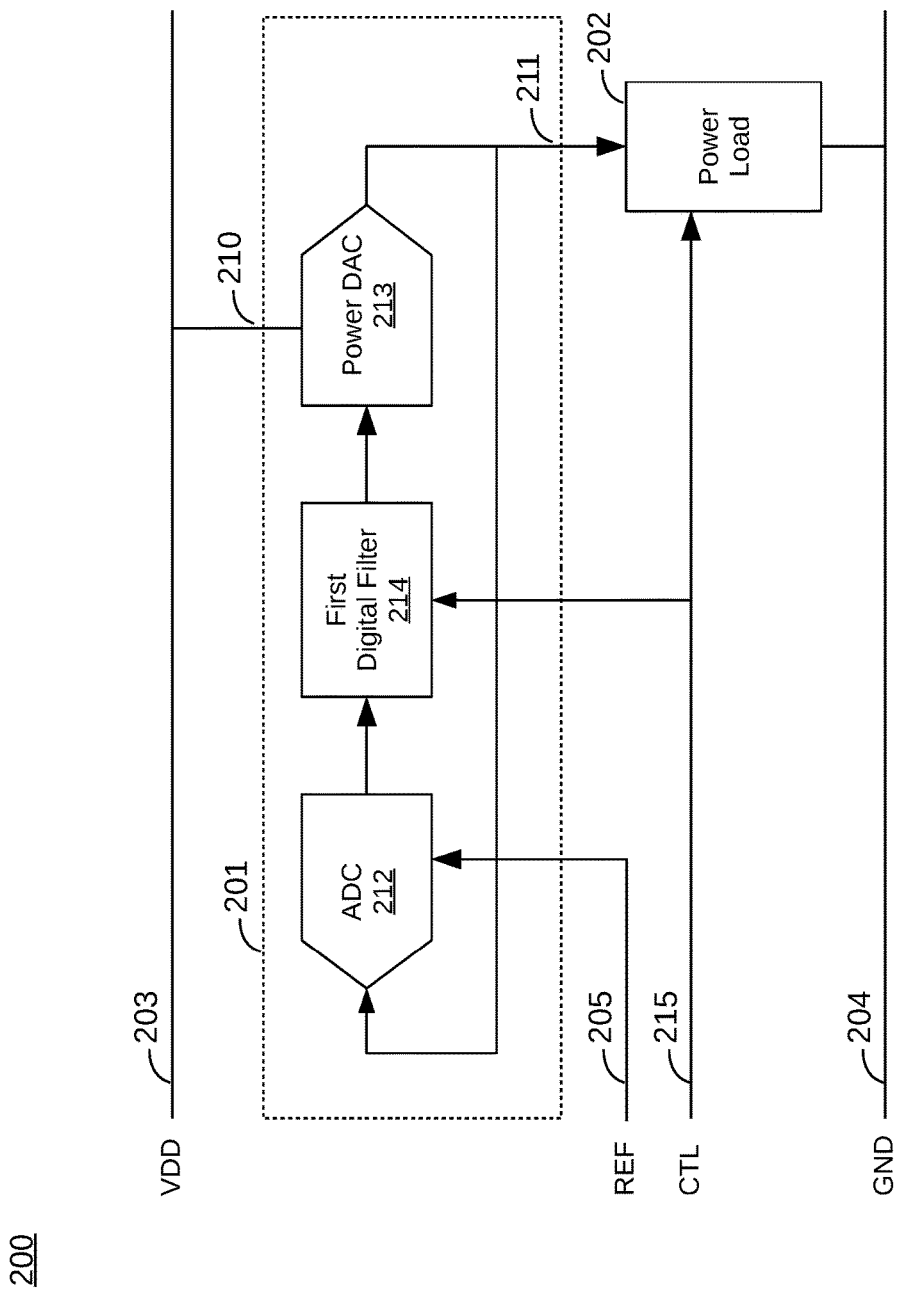
FIG. 2 illustrates an example digital regulator with loop filtering according to embodiments of the invention.

FIG. 2 illustrates an example digital regulator 201 with loop filtering according to embodiments of the invention. System 200 includes digital regulator 201, power load 202, VDD rail 203, GND rail 204, reference input 205, raw energy input 210, regulated energy output 211, ADC 212, first digital filter 214, power DAC 213, and mode control (CTL) input 215. Power DAC 213, ADC 212, and first digital filter 214 are configured in a negative feedback control loop. Like digital regulator 101, digital regulator 201 is a level regulator.

First digital filter 214 generates a first digital control code and its updates by performing operations, comprising filtering, on the ADC 212 digital output values. First digital filter 214 is included in a forward part of the negative feedback control loop, where it impacts the loop's behavior, including the speed at which the regulator can respond to changes, as well as the regulator's stability and accuracy. In some embodiments, first digital filter 214 may include a pole at frequency zero. In further embodiments, first digital filter 214 may include two poles at frequency zero and a single zero at a non-zero frequency. In yet further embodiments, first digital filter 214 may include any number of poles and/or zeros at any frequencies.

In a system 200 where power load 202 may have characteristics that are very dependent on, for example, a power management mode setting, such as power-saving or fully active mode, the requirements for first digital filter 214 to provide speed, accuracy, and stability may quickly change. Therefore, a mode control code reflecting a power management status that controls power load 202 also includes useful information for digital regulator 201 and first digital filter 214. Embodiments of the invention include mode control input 215 configured to receive a mode control code, where different mode control codes may identify, for example, an OFF mode, a fully active mode, a deep sleep mode, a standby mode, and so on. Mode control codes may be one or more bits wide. Although in this example power management was given as a reason to control modes, other system management may also control modes for individual blocks. For example, in a communication system, blocks may be put in different modes dependent on a direction of communication, etc. In embodiments, first digital filter 214 is configured to change between sets of filter coefficients or other filter parameters based on the mode control code received. For instance, if digital filter 214 includes a finite impulse response (FIR) filter, or an infinite impulse response (IIR) filter, the mode control code may dictate the use of a first, second, and so on, set of filter coefficients. Embodiments may include sets of pre-programmed filter coefficients to enable instant change of regulator characteristics along with the controlled status. Further embodiments may include storage of alternate state information for different modes.

While system 200 depicted in FIG. 2 shows power load 202 and first digital filter 214 receiving the same mode control code, in some embodiments first digital filter 214 may receive a different, but related, mode control code than power load 202.

Figure 3:
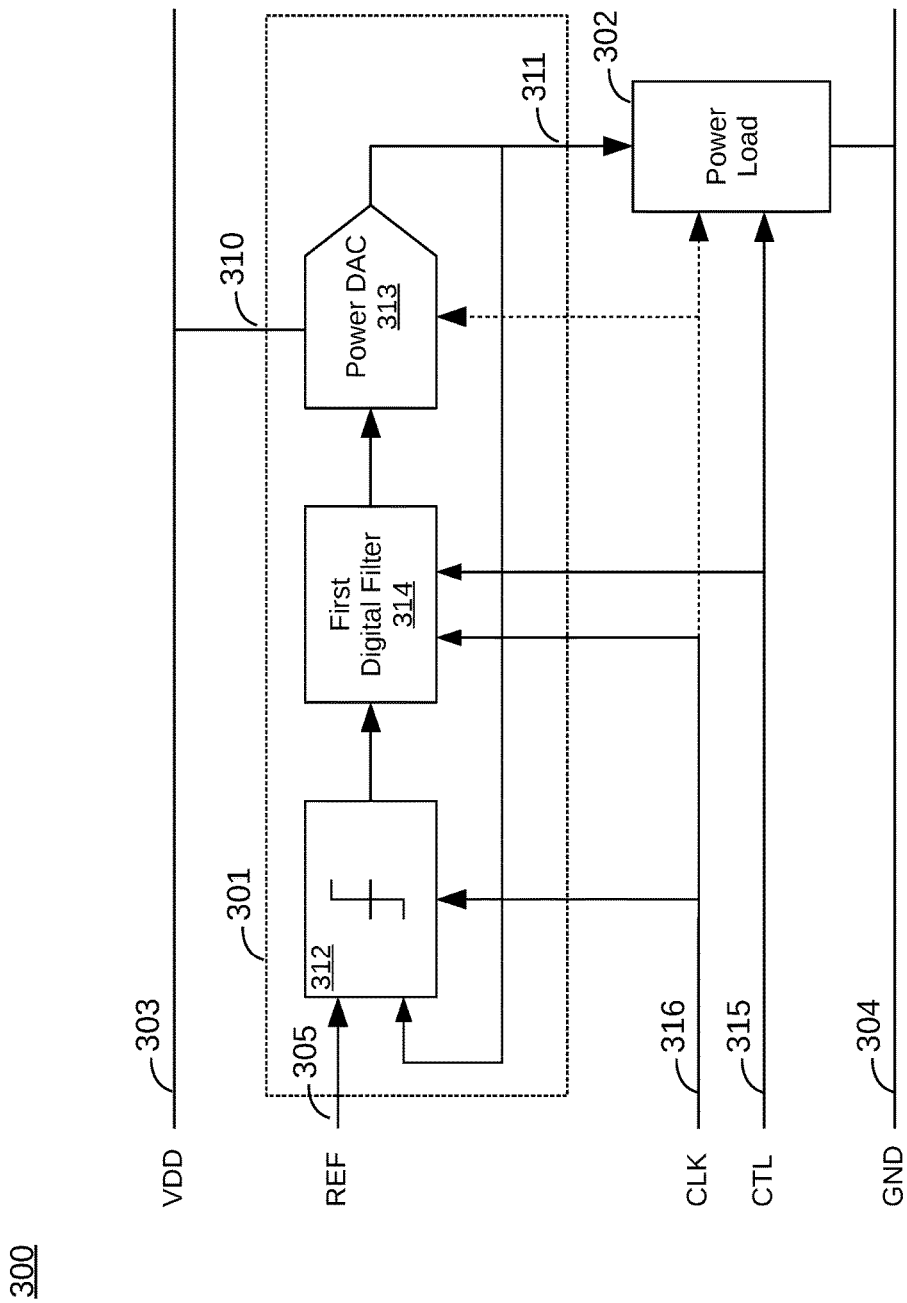
FIG. 3 illustrates an example mixed-signal regulator according to embodiments of the invention.

FIG. 3 illustrates an example mixed-signal regulator 301 according to embodiments of the invention. System 300 includes mixed-signal regulator 301, power load 302, VDD rail 303, GND rail 304, reference input 305, raw energy input 310, regulated energy output 311, first clocked comparator 312, first digital filter 314, power DAC 313, mode control input 315 and clock (CLK) input 316. Power DAC 313, first clocked comparator 312, and first digital filter 314 are configured in a negative feedback control loop. Like digital regulators 101 and 201, mixed-signal regulator 301 is a level regulator.

First clocked comparator 312 acts as a 1-bit ADC and fulfills the function of ADC 212 in FIG. 2. In the embodiments depicted in FIG. 3, first clocked comparator 312 receives a CLK signal from CLK input 316 which triggers a comparison between a first reference physical quantity received at reference input 305 and a sensed physical quantity from regulated energy output 311. For instance, if the first reference physical quantity is greater than the sensed physical quantity, first clocked comparator 312 will show a digital code "1" at its output, and if the sensed physical quantity is greater than the first reference physical quantity, first clocked comparator 312 will show a digital code "0" at its output. First digital filter 314 receives the successive 1-bit digital words from the clocked comparator 312 output and executes a filtering action on them to provide speed, accuracy and stability in the negative feedback loop. In some embodiments, first digital filter 314 may include a pole at frequency zero. In further embodiments, first digital filter 314 may include two poles at frequency zero and a single zero at a non-zero frequency. In yet further embodiments, first digital filter 314 may include any number of poles and/or zeros at any frequencies. At its output, first digital filter 314 produces a first digital control code and its updates as input signals for power DAC 313.

System 300 receives a CLK signal on clock input 316, and provides it to first clocked comparator 312 and first digital filter 314. Some embodiments of the invention may also provide the clock to power DAC 313 and further embodiments may provide the clock to power load 302. In yet further embodiments, power load 302 may use additional and/or entirely different clock signals.

Embodiments provide mode control codes received on mode control input 315 to first digital filter 314 to enable it to change between sets of filter coefficients, or to change between sets of other filter parameters. While system 300 depicted in FIG. 3 shows power load 302 and first digital filter 314 receiving the same mode control code, in some embodiments first digital filter 314 may receive a different, but related, mode control code than power load 302.

Figure 4:
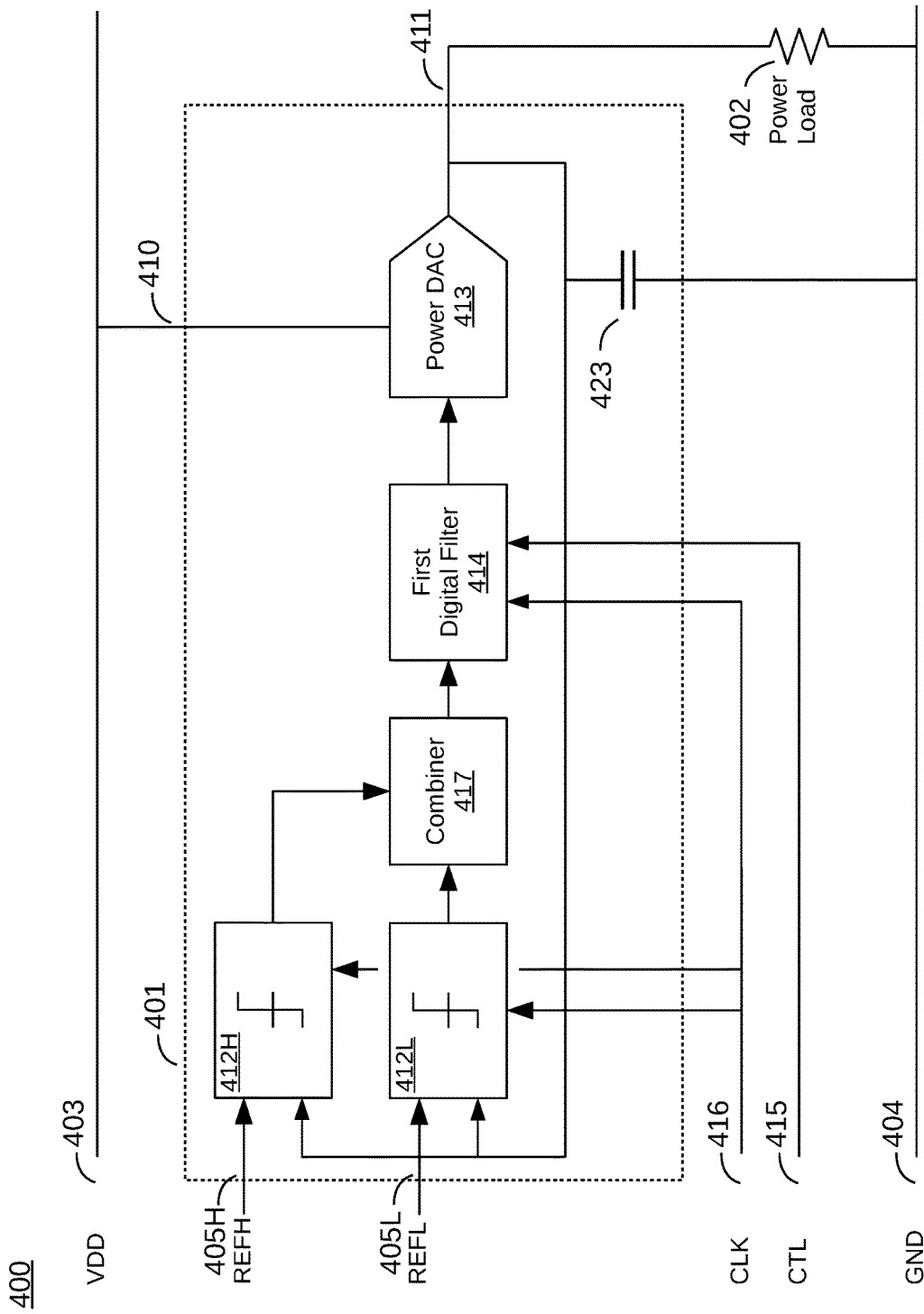
FIG. 4 illustrates an example range regulator according to an embodiment of the invention.

FIG. 4 illustrates an example range regulator 401 according to an embodiment of the invention. System 400 includes digital regulator 401, power load 402, VDD rail 403, GND rail 404, first reference input 405H, second reference input 405L, raw energy input 410, regulated energy output 411, first clocked comparator 412H, second clocked comparator 412L, combiner 417, first digital filter 414, power DAC 413, mode control input 415, clock input 416, and energy storage device 423. Power DAC 413, energy storage device 423, first clocked comparator 412H, second clocked comparator 412L, combiner 417, and first digital filter 414 are configured in a negative feedback control loop.

In embodiments, energy storage device 423, depicted in FIG. 4 as a capacitor, may include at least one of a capacitor, an inductor, and a rechargeable battery. Power load 402 may comprise an energy dissipating load, depicted in FIG. 4 as a resistor.

For the purposes of this document, a range regulator constitutes a regulator that is capable of regulating available energy as expressed by a sensed physical quantity within a range determined by a first reference physical quantity and a second reference physical quantity, wherein the sensed physical quantity is related to a portion of raw energy that is available in the power load. The sensed physical quantity may be a voltage, a current, or any other physical quantity that relates to the portion of the raw energy. First clocked comparator 412H receives the first reference physical quantity at its REFH input at 405H, and second clocked comparator 412L receives the second reference physical quantity at its REFL input at 405L.

When first clocked comparator 412H and second clocked comparator 412L receive a CLK signal from CLK input 416, they compare the sensed physical quantity with the first and the second reference physical quantities, respectively. At their outputs, first and second clocked comparators 412H-L will show digital codes representing the results of both comparisons, wherein the digital codes may include 1-bit digital words. Combiner 417 receives and combines the respective digital codes. The combining it performs may include, for example: producing a combined digital code "1" when both received digital codes are "1"; producing a combined digital code "−1" when both received digital codes are "0"; and producing a combined digital code "0" when the two received digital codes do not match each other.

First digital filter 414 receives the combined digital code at its input, and executes a filtering action on it. The filtering action may include any filtering methods known in the art to provide speed, accuracy and stability in a negative feedback loop. In some embodiments, first digital filter 414 may include a pole at frequency zero. In further embodiments, first digital filter 414 may include two poles at frequency zero and a single zero at a non-zero frequency. In yet further embodiments, first digital filter 414 may include any number of poles and/or zeros at any frequencies. At its output, first digital filter 414 produces a first digital control code and its updates as input signals for power DAC 413. In an example embodiment in which first digital filter 414 includes a simple integrator, an integrated number value inside digital filter 414 may increase when the combined digital code equals "1", or it may decrease when the combined digital code equals "−1", or it may remain unaltered when the combined digital code equals "0".

Some embodiments of the invention may include a mode control input 415 configured to receive a mode control code, as discussed previously. Mode control codes may be one or more bits wide. In these embodiments, first digital filter 414 is configured to change between sets of filter coefficients or other filter parameters based on the mode control code received. Further embodiments may include sets of preprogrammed filter coefficients to enable instant change of regulator characteristics along with the power management status.

Figure 5:
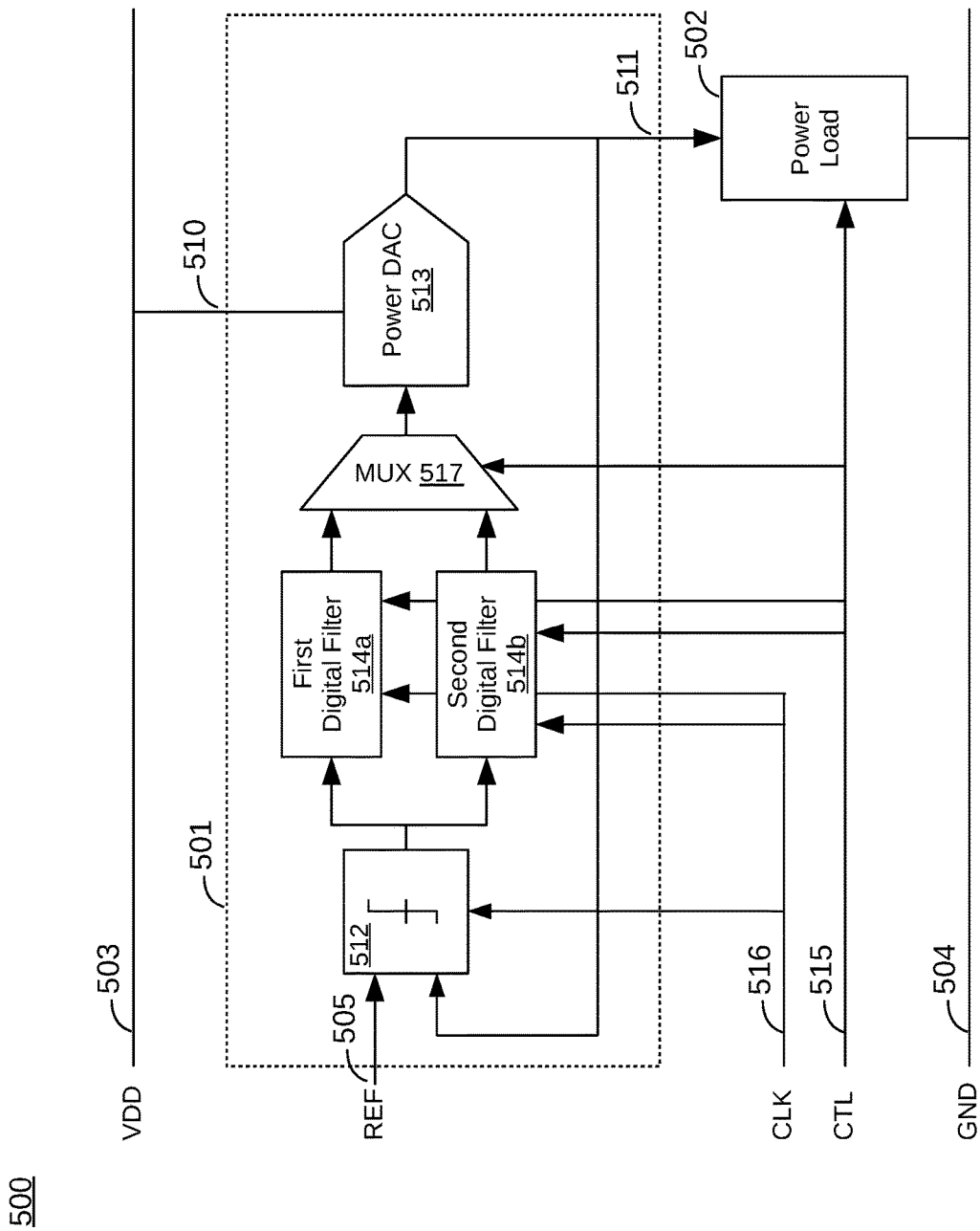
FIG. 5 illustrates an example multimode regulator according to an embodiment of the invention.

FIG. 5 illustrates an example multimode regulator 501 according to an embodiment of the invention. System 500 includes multimode regulator 501, power load 502, VDD rail 503, GND rail 504, first reference input 505, raw energy input 510, regulated energy output 511, first clocked comparator 512, first digital filter 514a, second digital filter 514b, multiplexer (MUX) 517, power DAC 513, mode control input 515 and clock input 516. Power DAC 513, first clocked comparator 512, first digital filter 514a, second digital filter 514b, and multiplexer 517 are configured in a negative feedback control loop.

Multimode regulator 501 functions in a manner similar to mixed-signal regulator 301 in FIG. 3. However, first clocked comparator 512 forwards its output digital codes in parallel to first digital filter 514a and second digital filter 514b, or in general, to two or more digital filters. Each of the two or more digital filters has an output coupled to a multiplexer 517 input. Each of the two or more digital filters, and multiplexer 517, receive a mode control code from mode control input 515. Based on the received mode control code, multiplexer 517 selects an output signal of one of the two or more digital filters, and forwards it to power DAC 513. Each of the two or more digital filters may execute a filtering action on output digital codes received from clocked comparator 512, wherein the filtering action is determined by the mode control code. For instance, the mode control code can determine a set of filter coefficients or other filter parameters applied to a filter. In some embodiments, the mode control code can further control if a filter is active or not. For some modes, it may interrupt clock signals received from clock input 516, so that a filter becomes inactive and saves power.

By applying multiple digital filters 514 instead of a single digital filter, it becomes possible to have smoother transitions when system 500 switches between modes. Having separate digital filters allows a state to be stored for each mode defined by the mode control input 515. This allows regulator 501 to change the delivered output power much more rapidly than either of the digital filters 514 can respond. For example, if the load is switched from a sleep mode, consuming very little power, to an active mode, consuming significant power, switching between filters can support the new power needs much more quickly than either filter 514 could respond.

Figure 6:
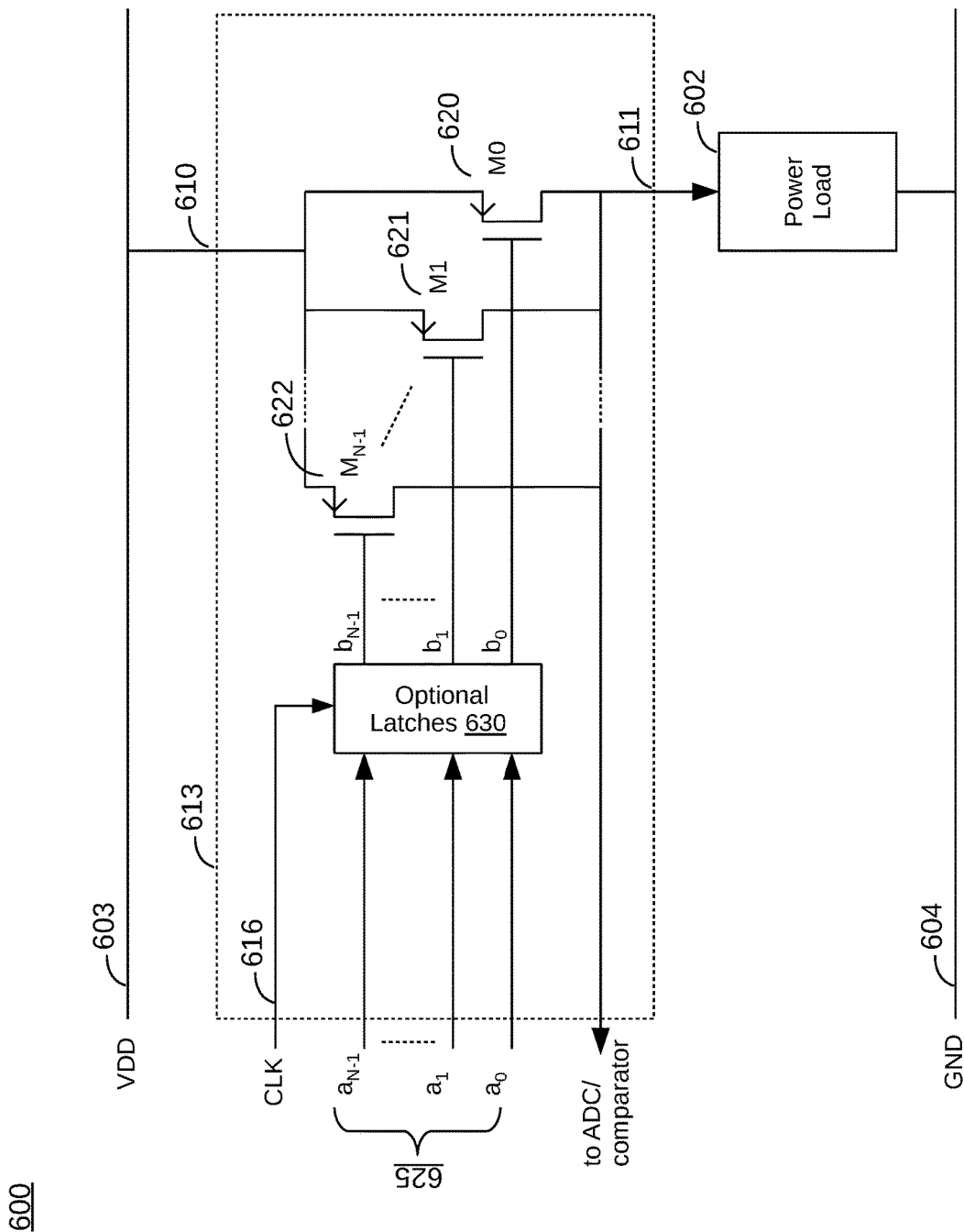
FIG. 6 illustrates details of an example power DAC according to embodiments of the invention.

FIG. 6 illustrates details of an example power DAC according to embodiments of the invention. System 600 includes power DAC 613, power load 602, VDD rail 603, GND rail 604, raw energy input 610, regulated energy output 611, optional clock input 616, transistors 620-622, digital input 625, and optional latches 630.

Power DAC 613 delivers a portion of raw energy available at its raw energy input 610 to power load 602 via regulated energy output 611. The portion is determined by a digital control code, which may have a width of N bits. Power DAC 613 receives the digital control code $a_0 \ldots a_{N-1}$ awl at its digital input 625. Some embodiments may be clocked, as shown, where digital control code $a_0 \ldots a_{N-1}$ is forwarded to latches 630. Upon receiving a clock pulse from clock input 616, latches 630 may forward digital control code $a_0 \ldots a_{N-1}$ to transistors 620-622 as clocked digital control code $b_0 \ldots b_{N-1}$. Other embodiments may not use optional clock input 616 and may not have latches 630. Those embodiments directly forward digital control code $a_0 \ldots a_{N-1}$ to transistors 620-622.

A bit $a_i$ or $b_i$ from the digital control code or clocked digital control code activates or deactivates corresponding transistor $M_i$, which forwards a portion of the raw energy available at raw energy input 610 to power load 602 via regulated energy output 611. Transistors $M_0 \ldots M_{N-1}$ (620-622) may be substantially equal sized, or they may have increasing sizes to give the bits of the digital control code increasing values. For instance, $M_0$ could have a unit size, $M_1$ could have 2 units size, $M_2$ could have 4 units size, etc., to stepwise linearly support control codes with binary numbers. Other embodiments could implement stepwise non-linear relations with the control code. An active transistor $M_i$ will forward a portion of the raw energy that is proportional to its size. Therefore, dependent on the digital control code, power DAC 613 will forward a smaller or larger portion of the raw energy available at raw energy input 610 to power load 602.

Some embodiments may include a resistor in series with the source or drain of each of the transistors $M_0 \ldots M_{N-1}$ (620-622). Yet other embodiments may include a current source in series with the source of each of the transistors $M_0 \ldots M_{N-1}$ (620-622) or a cascode transistor in series with the drain of each of the transistors $M_0 \ldots M_{N-1}$ (620-622).

The embodiment of power DAC 613 depicted in FIG. 6 is a very basic implementation of a DAC. The art knows many refinements that may lead to greater accuracy, speed, and efficiency. Embodiments may include any such refinements, without departure from the scope of the invention.

Figure 7:
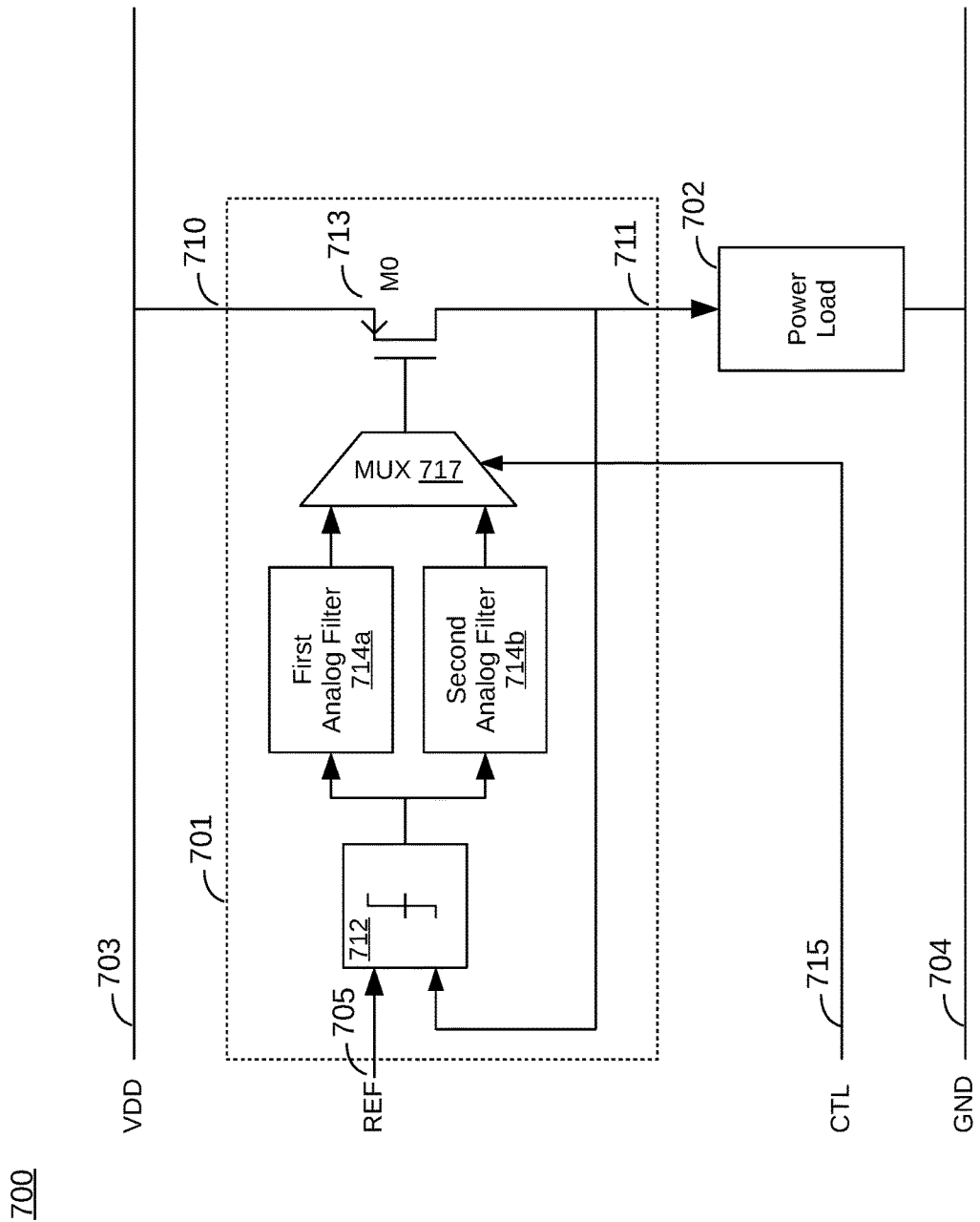
FIG. 7 illustrates an example analog multimode regulator according to an embodiment of the invention.

FIG. 7 illustrates an example analog multimode regulator 701 according to an embodiment of the invention. System 700 includes analog multimode regulator 701, power load 702, VDD rail 703, GND rail 704, first reference input 705, raw energy input 710, regulated energy output 711, first comparator 712, first analog filter 714a, second analog filter 714b, multiplexer (MUX) 717, power stage 713, and mode control input 715. Power stage 713, first comparator 712, first analog filter 714a, second analog filter 714b, and multiplexer 717 are configured in a negative feedback control loop.

Analog multimode regulator 701 functions in a manner similar to multimode regulator 601 depicted in FIG. 6. However, this embodiment functions using analog techniques. Comparator 712 forwards its output results in parallel to first analog filter 714a and second analog filter 714b, or in general, to two or more analog filters. Each of the two or more analog filters has an output coupled to a multiplexer 717 input. Multiplexer 717 receives a mode control code from mode control input 715. Based on the received mode control code, multiplexer 717 selects an output signal of one of the two or more analog filters, and forwards it to power stage 713. Each of the two or more analog filters performs a filtering action on the closed loop signal. The analog filter whose output signal is forwarded by multiplexer 717 to output stage 713 determines the characteristics of the closed loop, including which portion of energy available on raw energy input 710 is forwarded to power load 702 via regulated energy output 711. A reference physical quantity received on first reference input 705 and the mode control code determine the amount of energy the embodiment forwards to power load 702, as well as the general behavior of analog multimode regulator 701.

Some embodiments may leave out comparator 712, and simply provide a subtractor to subtract a physical quantity sensed at regulated energy output 711 from a first reference physical quantity, and provide the result to the two or more analog filters.

Some embodiments may include a single transistor as analog multimode regulator 701's power stage 713. Other embodiments may include more sophisticated power stages, as known in the art.

Figure 8:
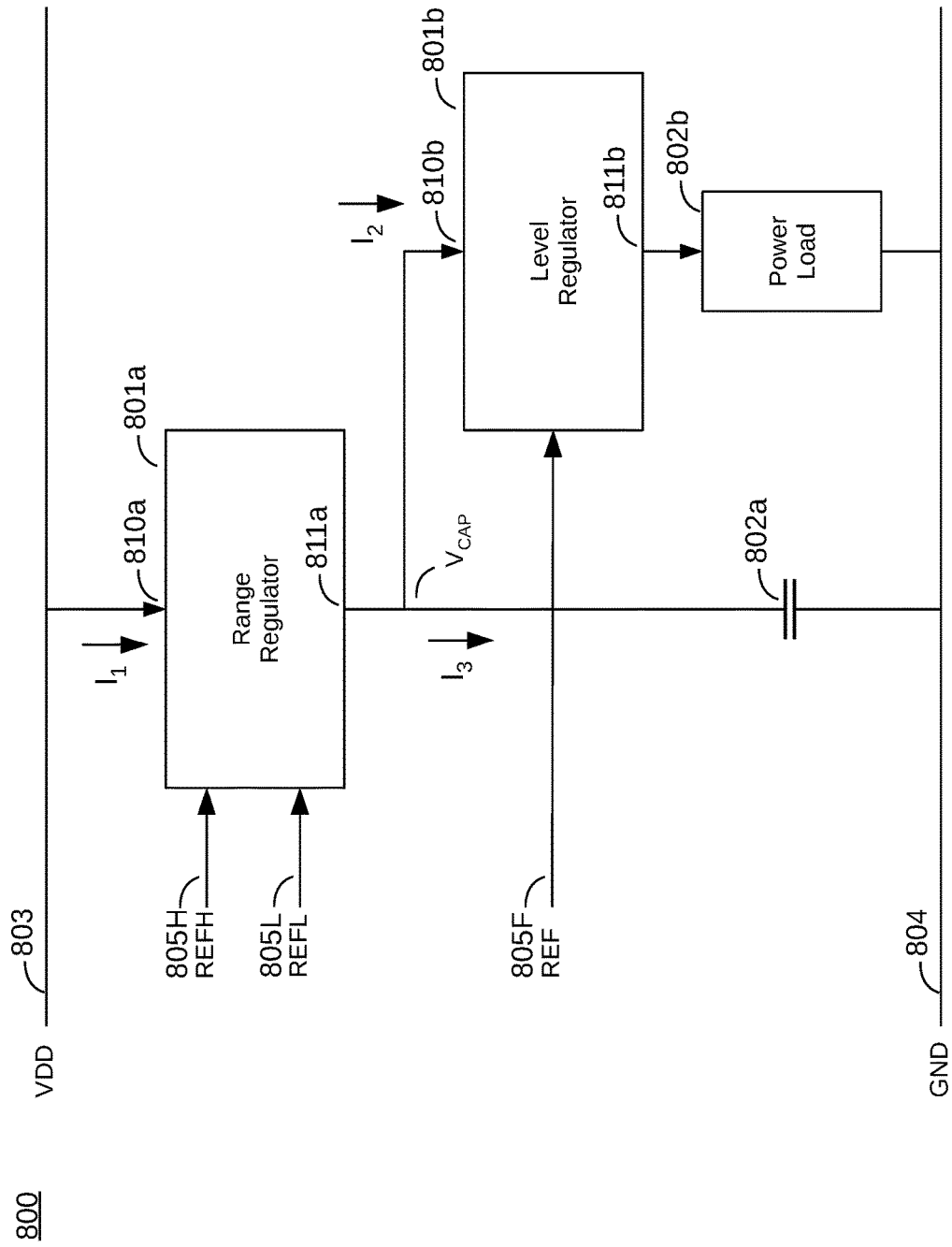
FIG. 8 illustrates an example two-step regulator system according to embodiments of the invention.

FIG. 8 illustrates an example 800 two-step regulator system according to embodiments of the invention. It combines use of a range regulator 801a and a level regulator 801b. Example 800 further includes VDD rail 803, GND rail 804, range high reference input 805H, range low reference input 805L, level reference input 805F, raw energy input 810a, and range regulated energy output 811a, range regulated energy input 810b, and level regulated energy output 811b, energy storage device 802a, and power load 802b. With reference to energy storage device 423 in FIG. 4, energy storage device 802a in FIG. 8 may be viewed as an integral part of range regulator 801a.

Combined use of a range regulator and a level regulator serves the dual purposes of providing a well regulated level of energy to a power load that may require big bursts of energy and reducing the noise impact that such bursts may have on the original source of raw energy.

In embodiments, energy storage device 802a may comprise at least one of a capacitor, an inductor, and a rechargeable battery.

Range regulator 801a takes a first portion of raw energy available at VDD rail 803 via its raw energy input 810a and forwards it via range regulated energy output 811a to energy storage device 802a and level regulator 801b. The first portion splits in a second portion going into energy storage device 802a and a third portion going into level regulator 801b. Energy storage device 802a stores energy. Some of the time, the second portion may be zero, and during this time energy storage device 802a may deliver part of its stored energy to level regulator 801b, so that the total energy available to level regulator 801b exceeds the third portion.

Range regulator 801a regulates energy at its range regulated energy output 811a such that a first sensed physical quantity (at 811a) will remain between range low reference physical quantity REFL and range high reference physical quantity REFH as received on range low reference input 805L and range high reference input 805H. In some embodiments, the first sensed physical quantity, the range low reference and range high reference physical quantities REFL and REFH may comprise voltages. In other embodiments, they may comprise currents. In yet other embodiments they may comprise physical quantities other than voltages or currents.

Level regulator 801b takes the energy available at its range regulated energy input 810b from range regulator 801a and energy storage device 802a and forwards a fourth portion of it to power load 802b.

Level regulator 801b regulates energy at its level regulated energy output 811b such that a second sensed physical quantity (at 811b) will lock to the level reference physical quantity REF as received on level reference input 805F. In some embodiments, the second sensed physical quantity and the level reference physical quantity REF may comprise voltages. In other embodiments, they may comprise currents. In yet other embodiments they may comprise physical quantities other than voltages or currents.

Filters in level regulator 801b may be optimized for known characteristics of the signal on range regulated energy input 810b. For example, if power load 802b periodically transitions through a known sequence of states and level regulator 801b delivers the correct power for each one (CTL signals are not shown in FIG. 8). This periodic sequence of power use will result in a predictable change in the signal on range regulated energy input 810b. The filters can be optimized to remove components of the periodic signal from the level regulated energy output 811b.

Figure 9:
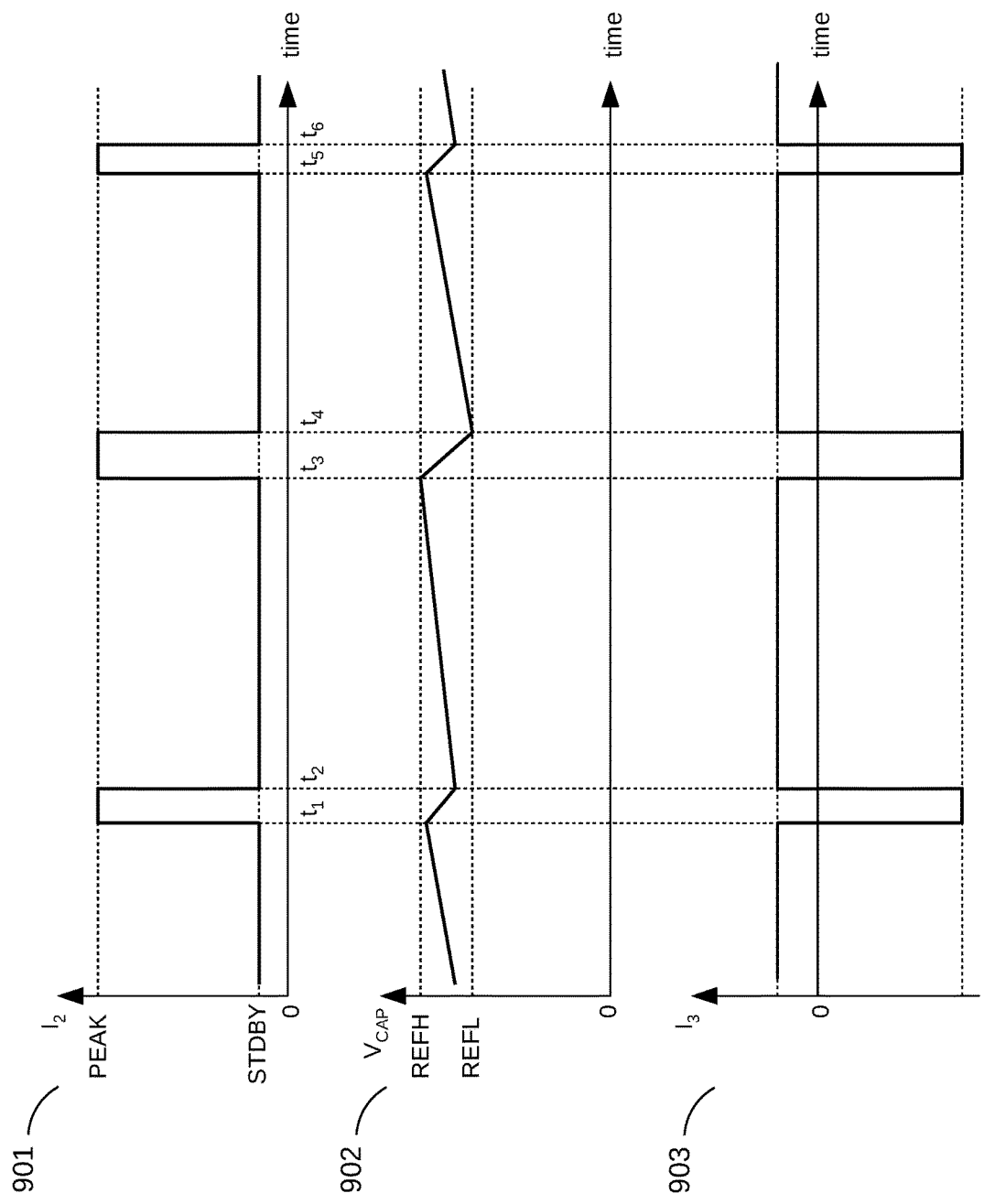
FIG. 9 illustrates an example method of dual mode regulation in a two-step regulator system according to an embodiment of the invention.

FIG. 9 illustrates an example method of dual mode regulation in a two-step regulator system according to an embodiment of the invention. Referring to FIG. 8, $I_1$ (not depicted here) represents a current flowing into raw energy input 810a; $I_2$ represents current flowing into range regulated energy input 810b; $I_3$ represents current flowing into energy storage device 802a; and $V_{CAP}$ represents a voltage across energy storage device 802a, which is also the input voltage of level regulator 801b.

The method in FIG. 9 shields the raw energy source from noise bursts caused by periodic bursts in energy use by power load 802b, while providing power load 802b with a steady level of energy. It assumes that bursts occur sufficiently close to each other and that each burst consumes not too little and not too much energy. The method attempts to keep $I_1$ at a constant level. It can be seen that $I_1$ splits into $I_2$ and $I_3$, therefore $I_1 = I_2 + I_3 =$ constant.

Graph 901 shows current $I_2$ over time. Prior to time $t_1$, its level is low (STDBY). From time $t_1$ to $t_2$ it is high (PEAK), after which it goes low again. It goes high again from $t_3$ to $t_4$, and from $t_5$ to $t_6$.

The method in this embodiment keeps $I_1$ at a constant level higher than STDBY, but lower than PEAK. Therefore, current $I_3$ is positive when $I_2 =$ STDBY, and energy storage device 802a increases its stored energy. However, when $I_2 =$ PEAK, current $I_3$ is negative and energy storage device 802a delivers energy. This is shown in graph 903. If energy storage device 802a is a capacitor, as shown in FIG. 8, then the voltage $V_{CAP}$ will increase during STDBY and decrease during PEAK, as shown in graph 902. Range regulator 801a regulates $V_{CAP}$ to stay between the REFH and REFL levels. The system provides high isolation to the raw energy source from noise generated by power load 802b as long as $V_{CAP}$ stays between the REFH and REFL levels, without reaching them. Should VCAP reach REFH during STDBY, then $I_1$ will diminish until the next burst appears. Should VCAP reach REFL during a burst, then $I_1$ will increase until the end of the burst to prevent the capacitor from further discharging.

Although the description has been described with respect to particular embodiments thereof, these particular embodiments are merely illustrative, and not restrictive. All such variations and modifications are to be considered within the ambit of the present invention the nature of which is to be determined from the foregoing description.

It will be understood that the invention disclosed and defined in this specification extends to all alternative combinations of two or more of the individual features mentioned or evident from the text or drawings. All of these different combinations constitute various alternative aspects of the invention.

Any suitable technology for manufacturing electronic devices can be used to implement the circuits of particular embodiments, including bipolar, JFET, MOS, NMOS, PMOS, CMOS, BiCMOS, HBT, MESFET, FinFET, etc. Different semiconductor materials can be employed, such as silicon, germanium, SiGe, GaAs, InP, graphene, etc. Circuits may have single-ended or differential inputs, and single-ended or differential outputs. Terminals to circuits may function as inputs, outputs, both, or be in a high-impedance state, or they may function to receive supply power, a ground reference, a reference voltage, a reference current, or other. Although the physical processing of signals may be presented in a specific order, this order may be changed in different particular embodiments. In some particular embodiments, multiple elements, devices, or circuits shown as sequential in this specification can be operating in parallel.

Particular embodiments may be implemented in a computer-readable storage medium for use by or in connection with an instruction execution system, apparatus, system, or device. Particular embodiments can be implemented in the form of control logic in software, firmware, hardware or a combination of those. The control logic, when executed by one or more processors, may be operable to perform that which is described in particular embodiments. For example, a tangible medium such as a hardware storage device can be used to store the control logic, which can include executable instructions.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope to implement a program or code that can be stored in a machine-readable medium to permit a computer to perform any of the methods described above.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Thus, while particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

The invention claimed is:

1. A method of regulating supply energy in a digital regulator, comprising:
   receiving a first digital control code;
   receiving raw energy from a power supply;
   from a power digital-to-analog convertor (DAC), forwarding a portion of the raw energy to a power load, wherein the portion is determined by the first digital control code;
   sensing a physical quantity related to the portion of the raw energy in the power load, and forwarding the sensed physical quantity to an analog-to-digital converter (ADC), wherein the ADC comprises a first clocked comparator and a first digital filter;
   receiving a first reference physical quantity and forwarding it to the ADC;
   receiving a clock signal;
   in the first clocked comparator, at a time of receiving the clock signal, comparing the sensed physical quantity to the first reference physical quantity to obtain a first clocked comparator output signal;
   forwarding the first clocked comparator output signal to the first digital filter;
   in the first digital filter, filtering the first clocked comparator output signal to obtain an updated first digital control code and to allow the sensed physical quantity to lock to the first reference physical quantity; and
   regularly repeating the previous steps with the updated first digital control code to obtain a proportional relation between the sensed physical quantity and the first reference physical quantity.

2. The method of claim 1 wherein the sensed physical quantity includes at least one of a voltage and a current.

3. The method of claim 1 wherein the sensed physical quantity includes a quantity other than a voltage or a current.

4. The method of claim 1, wherein filtering includes using a pole at frequency zero.

5. The method of claim 1, wherein filtering includes using two poles at frequency zero and a single zero at a non-zero frequency.

6. The method of claim 1, wherein the ADC comprises a second clocked comparator, further comprising:
   receiving a second reference physical quantity;
   forwarding the second reference physical quantity to the second clocked comparator;
   in the second clocked comparator, at the time of receiving the clock signal, comparing the sensed physical quantity to the second reference physical quantity to obtain a second clocked comparator output signal;
   combining the first and second clocked comparator output signals to obtain a combined filter input signal;
   forwarding the combined filter input signal to the first digital filter; and
   in the first digital filter, filtering the combined filter input signal to obtain the updated first digital control code and to allow the sensed physical quantity to vary between the first and second reference physical quantities.

7. The method of claim 6, wherein combining comprises:
   receiving the first and second clocked comparator output signals;
   producing a combined filter input signal "1" when the first clocked comparator output signal indicates that the sensed physical quantity has a value greater than the first reference physical quantity;
   producing a combined filter input signal "−1" when the second clocked comparator output signal indicates that the sensed physical quantity has a value less than the second reference physical quantity;
   producing a combined filter input signal "0" when the first and second clocked comparator output signals indicate that the sensed physical quantity has a value in between the first and second reference physical quantities.

8. The method of claim 1, further comprising:
   receiving a mode control code;
   forwarding the mode control code to the first digital filter; and
   in the first digital filter, modifying filter behavior based on the mode control code.

9. The method of claim 1, wherein the ADC comprises a second digital filter and a digital multiplexer, further comprising:
   receiving a mode control code;
   forwarding the first clocked comparator output signal to the second digital filter;
   in the second digital filter, filtering the first clocked comparator output signal to obtain a second updated digital control code; and
   in the digital multiplexer, based on the mode control code, selecting one of the first and the second updated digital control codes to determine the portion of raw energy.

10. The method of claim 9, further comprising:
    forwarding the mode control code to at least one of the first and the second digital filters; and
    in the at least one of the first and the second digital filters, modifying filter behavior based on the mode control code.

11. A method of regulating supply energy in an analog regulator, comprising:
    receiving raw energy from a power supply;
    receiving an analog control signal;
    from a power stage, forwarding a portion of the raw energy to a power load, wherein the portion is determined by the analog control signal;
    sensing a physical quantity related to the portion of the raw energy in the power load, and forwarding the sensed physical quantity to a comparator;

receiving and forwarding a reference physical quantity to the comparator;
receiving a clock signal;
in the comparator, comparing the sensed physical quantity to the reference physical quantity to obtain a comparator output signal;
forwarding the comparator output signal to two or more analog filters;
in the two or more analog filters, filtering the comparator output signal to obtain two or more updated analog control signals;
forwarding the two or more updated analog control signals to an analog multiplexer;
receiving a mode control code;
in the analog multiplexer, based on the mode control code, selecting one of the two or more updated analog control signals to determine the portion of raw energy; and
continuously repeating the previous steps with the selected one of the two or more updated analog control signals to obtain a proportional relation between the sensed physical quantity and the first reference physical quantity.

12. The method of claim 11 wherein the sensed physical quantity includes a voltage.

13. The method of claim 11 wherein the sensed physical quantity includes a current.

14. A level regulator circuit, comprising:
a power digital-to-analog converter (DAC) with a raw energy input, a digital control code input, and a regulated power output, wherein the raw energy input is configured to receive raw energy from a power supply, and the regulated power output is configured to deliver regulated energy to a power load;
an analog-to-digital converter (ADC), with a first input coupled with the regulated power output, wherein the first input is configured to receive a sensed physical quantity related to a portion of the raw energy in the power load, and with a second input configured to receive a reference physical quantity, wherein the ADC comprises a first clocked comparator and the first clocked comparator is configured to compare the sensed physical quantity to the reference physical quantity upon receiving a clock signal to obtain a first clocked comparator output signal;
a first digital filter with:
  (a) an input coupled to an ADC output;
  (b) a mode control code input, wherein the digital filter is capable of modifying filter behavior based on a code received on the mode control code input; and
  (c) an output at least part of the time directly or indirectly coupled with the power DAC digital control code input;
wherein the first digital filter is configured to filter the first clocked comparator output signal to obtain an updated first digital control code and to allow the sensed physical quantity to lock to the first reference physical quantity; and
the level regulator circuit is configured to regularly repeat the previous steps with the updated first digital control code to obtain a proportional relation between the sensed physical quantity and the reference physical quantity.

15. The level regulator circuit of claim 14, further comprising:
a second digital filter, with
an input coupled with the ADC output; and
a mode control code input, wherein the second digital filter is capable of modifying filter behavior based on the code received on the mode control code input;
an output; and
a digital multiplexer with inputs coupled with the first and second digital filter outputs, wherein the digital multiplexer is configured to receive a mode control code, and based on the mode control code select one of the first and second digital filters, and with an output coupled with the power DAC.

16. A range regulator circuit, comprising:
a power digital-to-analog converter (DAC) with a raw energy input, a digital control code input, and a regulated power output, wherein the raw energy input is configured to receive raw energy from a power supply, and the regulated power output is configured to deliver regulated energy to a power load;
a first and a second clocked comparator, each with a first input coupled with the regulated power output, wherein the first inputs are configured to receive a sensed physical quantity related to a portion of the raw energy in the power load, and with a second input configured to each receive a separate reference physical quantity;
a combiner configured to combine digital codes output by the first and the second clocked comparators and to deliver a combined digital code; and
a first digital filter, with an input coupled with a combiner output and configured to filter the combined digital code, and with an output coupled with the power DAC digital control code input;
wherein the range regulator circuit is configured to:
upon receiving a clock signal, compare the sensed physical quantity to the separate reference physical quantities in the first and second clocked comparators to obtain first and second clocked comparator output signals;
in the first digital filter, filter the first and second clocked comparator output signals to obtain an updated first digital control code and to allow the sensed physical quantity to lock to a value between the separate reference physical quantities; and
regularly repeat the previous steps with the updated first digital control code to obtain a proportional relation between the sensed physical quantity and the separate reference physical quantities.

17. The range regulator circuit of claim 16, further comprising:
one or more additional digital filters, each with inputs coupled with outputs of the first and second clocked comparator; and
a digital multiplexer with inputs each coupled with a separate output of the first and the one or more additional digital filters, wherein the digital multiplexer is configured to receive a mode control code, and based on the mode control code select one of the first and the one or more additional digital filters, and with an output coupled with the power DAC.

18. The range regulator circuit of claim 16, wherein the first digital filter has a mode control code input, wherein the first digital filter is capable of modifying filter behavior based on a code received on the mode control code input.

19. The range regulator circuit of claim 16, wherein the first digital filter is configured to keep a physical quantity sensed at the regulated power output between the two reference physical quantities.

20. A two-step regulator system, comprising:

a range regulator with a raw energy input configured to receive raw energy from a power supply, two reference inputs, and a first regulated power output coupled to an energy storage device;

a level regulator with a raw energy input coupled to the range regulator regulated power output, one reference input, and a second regulated power output coupled to a power load;

wherein:

the range regulator comprises:

(a) a power digital-to-analog converter (DAC) with the raw energy input, a digital control code input, and the first regulated power output, wherein the raw energy input is configured to receive raw energy from the power supply, and the first regulated power output is configured to deliver first regulated energy to the level regulator raw energy input;

(b) a first and a second clocked comparator, each with a first input coupled with the first regulated power output and configured to receive a sensed physical quantity related to a portion of the first regulated energy, and with a second input configured to each receive a separate reference physical quantity, wherein the first and second clocked comparator are configured to, upon receiving a clock signal, compare the sensed physical quantity with the separate reference physical quantities and to output a digital code based on a result of comparing;

(c) a combiner configured to combine digital codes output by the first and the second clocked comparators and to deliver a combined digital code; and (d) a first digital filter configured to execute a filtering action on the combined digital code and to produce an updated digital control code for the digital control code input;

the range regulator is configured to regulate a first physical quantity on the energy storage device between limits determined by signal levels on the two range regulator reference inputs; and the level regulator is configured to regulate a second physical quantity on the power load to a level determined by a signal level on the level regulator reference input.

21. The two-step regulator system of claim 20, wherein the energy storage device includes at least one of a capacitor, an inductor, and a rechargeable battery.

22. The two-step regulator system of claim 20, wherein the range regulator is configured to draw a constant current from the power supply and the level regulator is configured to deliver a constant voltage to the power load.

* * * * *